United States Patent
Wong

(10) Patent No.: US 9,477,587 B2
(45) Date of Patent: Oct. 25, 2016

(54) METHOD AND APPARATUS FOR A VOLUME MANAGEMENT SYSTEM IN A NON-VOLATILE MEMORY DEVICE

(75) Inventor: Wanmo Wong, Menlo Park, CA (US)

(73) Assignee: Micron Technology, Inc., Boise, ID (US)

(*) Notice: Subject to any disclaimer, the term of this patent is extended or adjusted under 35 U.S.C. 154(b) by 1014 days.

(21) Appl. No.: 12/101,713

(22) Filed: Apr. 11, 2008

(65) Prior Publication Data

US 2009/0259799 A1  Oct. 15, 2009

(51) Int. Cl.
*G06F 12/02* (2006.01)
*G06F 12/00* (2006.01)

(52) U.S. Cl.
CPC ......... *G06F 12/0207* (2013.01); *G06F 12/02* (2013.01); *G06F 12/0215* (2013.01); *G06F 2212/2022* (2013.01)

(58) Field of Classification Search
CPC .................................................. G06F 12/02
USPC .......................................................... 711/103
See application file for complete search history.

(56) References Cited

U.S. PATENT DOCUMENTS

| | | | |
|---|---|---|---|
| 5,479,638 A | 12/1995 | Assar et al. | 395/430 |
| 5,671,388 A * | 9/1997 | Hasbun | 711/103 |
| 5,974,517 A | 10/1999 | Gaudet | 711/173 |
| 6,438,665 B2 | 8/2002 | Norman | 711/159 |
| 6,507,905 B1 | 1/2003 | Hubacher et al. | 713/1 |
| 6,704,852 B2 | 3/2004 | Lai et al. | 711/206 |
| 7,019,998 B2 | 3/2006 | Tran et al. | 365/49 |
| 2003/0163594 A1* | 8/2003 | Aasheim et al. | 709/310 |
| 2004/0080985 A1* | 4/2004 | Chang et al. | 365/185.33 |
| 2007/0025151 A1* | 2/2007 | Lee | 365/185.11 |
| 2007/0245067 A1* | 10/2007 | Yero | 711/103 |
| 2007/0245068 A1* | 10/2007 | Yero | 711/103 |
| 2007/0300130 A1* | 12/2007 | Gorobets | 714/766 |
| 2008/0034153 A1* | 2/2008 | Lee et al. | 711/103 |
| 2008/0072120 A1* | 3/2008 | Radke | 714/768 |
| 2008/0086631 A1* | 4/2008 | Chow et al. | 713/2 |
| 2008/0112238 A1* | 5/2008 | Kim et al. | 365/200 |
| 2008/0198651 A1* | 8/2008 | Kim | 365/185.03 |
| 2009/0157989 A1* | 6/2009 | Karamcheti et al. | 711/156 |
| 2010/0049908 A1* | 2/2010 | Gonzalez et al. | 711/103 |

* cited by examiner

*Primary Examiner* — Mark Giardino, Jr.
*Assistant Examiner* — Gautam Sain
(74) *Attorney, Agent, or Firm* — Dorsey & Whitney LLP

(57) ABSTRACT

Embodiments for partitioning a non-volatile memory device is described. In one embodiment a memory system includes a first addressable range of memory blocks for storing different types of data. The memory system is partitioned to include a second addressable range of memory blocks capable of storing data indicating attributes of the first addressable range of memory blocks. The second addressable range of memory blocks may also be periodically updated such that the capacities of the first addressable range of memory blocks may be dynamically adjusted depending on application needs and changes to the non-volatile memory device over time. In some embodiments, one partition of a memory device may be configured for high reliability data storage while a second partition is configured for normal reliability storage.

24 Claims, 6 Drawing Sheets

METHOD AND APPARATUS FOR A VOLUME MANAGEMENT SYSTEM IN A NON-VOLATILE MEMORY DEVICE

TECHNICAL FIELD

Embodiments of the invention relate to non-volatile memory devices, and, more particularly, to a non-volatile memory device having a volume management system for high and normal reliability data storage.

BACKGROUND OF THE INVENTION

Non-volatile memory is a type of memory that can retain data and information even when power is not applied. An example of non-volatile memory that is being used in a variety of applications such as cellular phones, digital audio players, and digital cameras, is "flash memory." Flash memory is a form of electrically erasable programmable memory where data can be written to or erased in blocks of memory. The cell density of flash memory devices can be very high, often as high as conventional dynamic random access memory (DRAM) cells. Flash memory devices also have relatively fast data access times and require low operating power. With improvements in programming capabilities and the continually increasing demand for persistent and low-power memory devices, the application of flash memory in many other areas has expanded very rapidly.

The storage capacity of a flash memory array can be increased by storing multiple bits of data in each flash memory cell. This can be accomplished by storing multiple levels of charge on the floating gate of each cell. These memory devices are commonly referred to as multi-bit flash memory cells or multi-level cells ("MLC"). In an MLC, multiple bits of binary data corresponding to distinct threshold voltage levels defined over respective voltage ranges are stored within a single cell. Each distinct threshold voltage level corresponds to a respective combination of data bits. Specifically, the number N of bits requires $2^N$ distinct threshold voltage levels. The development of MLC NAND flash has dramatically increased the storage capacity of flash memory devices.

A typical flash memory device includes a memory array containing a large number of flash memory cells arranged in rows and columns. Two common types of flash memory array architectures are the "NAND" and "NOR" architectures, so called for the logical form in which the basic flash memory cell configuration of each is arranged. The NAND flash architecture enables faster write and erase operations by programming blocks of data, and is conventionally ideal for low-cost, high-density, high-speed program/erase applications. The individual memory cells of the NOR flash architecture are connected in parallel, which enables the device to achieve random access. NOR flash memory is ideal for lower-density, high-speed read-only applications such as code-storage applications that do not need to be frequently updated. The NOR flash memory conventionally has a faster access time and are more robust than NAND flash, but require longer erasing and programming times.

Devices that support the NAND flash memory as an alternative to or an addition to NOR flash memory have made NAND flash a viable alternative for a broader array of applications. Greater demand for high data storage capacity and performance requirements particularly for embedded applications such as cellular phones, handheld computers and other portable devices have increased significantly. However, due to the high reliability requirement for storing program data such as operating system ("OS") data or boot code, the conventional approach has been to store OS data in a highly reliable location. An integrated memory device incorporating the two types of flash memory combines the robustness of the NOR flash architecture for storing high reliability data and the large capacity of the NAND flash architecture for storing general user data that require less reliable storage. Therefore, memory architectures that combine NOR with NAND for data storage, or that use NAND as the primary flash memory in combination with low power DRAM in which the program code can be stored and accessed are highly desired.

The NAND/NOR flash devices have generally work well for a number of applications to increase the storage capacity of these devices. In the NAND/NOR devices, the NAND architecture is used to store user-type data, and the NOR architecture is used to store operating system-type data. However, as portable devices continue to decrease in size, and the demand for smaller memory devices grows, reductions in the overall size of the memory device are limited due to the bulky size of the NOR flash memory. Although, it is more desireable to utilize a single architecture, namely the MLC NAND architecture, to store both the user data and the high reliability data, the MLC NAND architecture may not meet the reliability requirements of many applications. While it is more economical to have all data types on one MLC NAND system, a highly reliable system is necessary for storing high reliability data, such as OS software data and code.

One possible solution in the prior art has been to utilize MLCs for storing user data and single-level memory cells for storing high reliability data in a single SLC NAND device. While MLCs have a higher storage capacity due to each cell being able to store more charge states, SLCs may be programmed and read at a faster rate since only one bit is stored in each cell. Therefore, since only one threshold level is necessary to read the single bit, SLCs require less precision and the single bit can be stored more reliably. Due to the large capacity of the MLC NAND device and the need for an advanced file management system, the allocation of SLC-type storage and the MLC-type storage are typically permanently assigned on the device. If spare SLC-type memory block eventually go bad or become unusable, the capacity of the SLC-type storage region cannot be adjusted and the device cannot be updated any further. Furthermore, these file management systems are typically stored external to the device, such as in software stored in the processor or memory controller. In order to correctly access the various regions of the MLC memory, each block of memory must include individual markers, headers, and block attribute data. In some cases, each page or sector of the memory block must allocate space to store tag bits and other identifiers that can be tracked by the file management system. The file management system then has the burden of tracking a plethora of markers, identifiers and block attribute information throughout the device. Consequently, prior art multi-mode MLC memory systems are prone to errors, misplaced data, and delays when responding to data requests or writes.

Therefore, there is a need for a memory system with the ability to store both less reliable data and high reliability data on the same device, and a need to dynamically manage memory partitions at a centralized location.

DETAILED DESCRIPTION

Embodiments of the present invention are directed to non-volatile memory devices in which a multi-level cell ("MLC") flash memory device includes a volume management system and method for managing high and normal reliability data stored in the memory device. Certain details are set forth below to provide a sufficient understanding of the embodiments of the invention. However, it will be clear to one skilled in the art that the embodiments of the invention may be practiced without these particular details. In other instances, well-known circuits, control signals, and timing protocols have not been shown in detail in order to avoid unnecessarily obscuring the embodiments of the invention.

Figure 1:
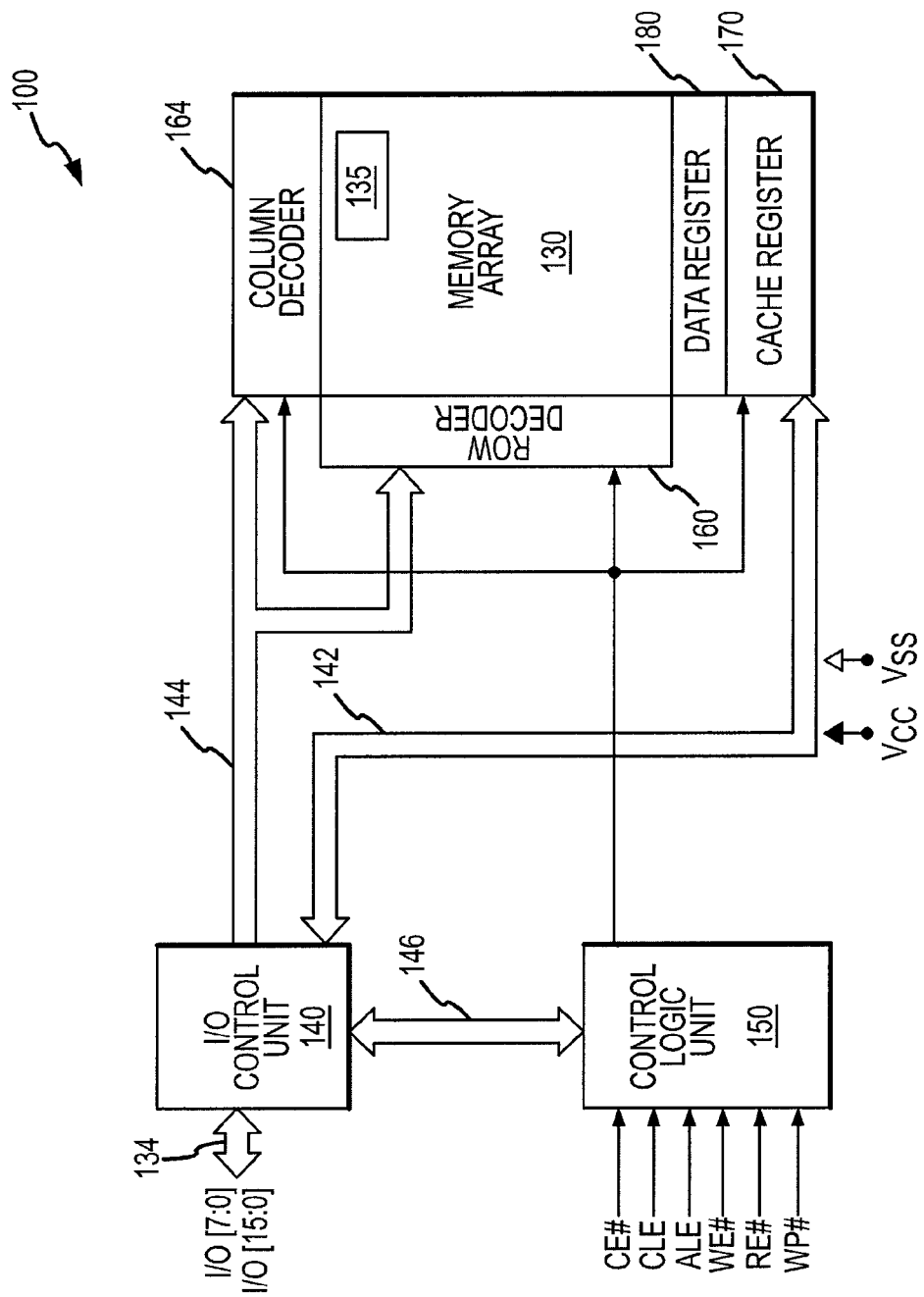
FIG. 1 is a block diagram showing a non-volatile memory device, according to an embodiment of the invention.

A flash memory device 100 that includes an MLC NAND memory device having a volume management system to manage high and normal reliability data according to one embodiment of the invention is shown in FIG. 1. The flash memory device 100 includes a memory array 130 of flash memory cells arranged in banks of rows and columns.

Most command signals, address signals and write data signals are applied to the memory device 100 as sets of sequential input/output ("I/O") signals transmitted through an I/O bus 134. Similarly, read data signals are output from the flash memory device 100 through the I/O bus 134. The I/O bus is connected to an I/O control unit 140 that routes the signals between the I/O bus 134 and an internal data bus 142, an internal address bus 144, and an internal command bus 146. The flash memory device 100 also includes a control logic unit 150 that receives a number of control signals either externally or through the command bus 146 to control the operation of the memory device 100. The address bus 144 applies row address signals to a row decoder 160 and column address signals to a column decoder 164. The row decoder 160 asserts word select lines for rows in the memory array 130 corresponding to the decoded row address signals. Similarly, the column decoder 164 enables write data signals to be applied to bit lines for columns corresponding to the column address signals and allow read data signals to be coupled from bit lines for columns corresponding to the column address signals.

In response to the memory commands decoded by the control logic unit 150, the flash memory cells in the array 130 are erased, programmed, or read. The memory array 130 is programmed on a row-by-row or page-by-page basis. After the row address signals have been applied to the address bus 144, the I/O control unit 140 routes write data signals to a cache register 170. The write data signals are stored in the cache register 170 in successive sets each having a size corresponding to the width of the I/O bus 134. The cache register 170 sequentially stores the sets of write data signals for an entire row or page of flash memory cells in the array 130. All of the stored write data signals are then used to program a row or page of memory cells in the array 130 selected by the row address coupled through the address bus 144. In a similar manner, during a read operation, data signals from a row or page of memory cells selected by the row address coupled through the address bus 144 are stored in a data register 180. Sets of data signals corresponding in size to the width of the I/O bus 134 are then sequentially transferred through the I/O control unit 140 from the data register 180 to the I/O bus 134.

While the main advantage of the MLC arrays is the high-density storage capacity, the MLC architecture lacks the speed and reliability of flash memory having a single-level cell ("SLC") architecture. Programming and read times are faster for SLCs since only one bit is stored per cell. Less precision is required to determine the logic state of each cell, and less voltage reference comparisons are used, making the SLCs less prone to errors. Additionally, because of tighter margins, MLCs are more susceptible to errors due to charge leakage or other disturbances from adjacent cells. For example single or fewer programming pulses are needed for the single-bit cell instead of the multiple programming pulses for the multi-bit cell. If adequate error-correction codes are utilized, the SLC arrays are capable of ensuring higher data integrity, making SLCs ideal for storing high reliability data such as OS software or boot code. The memory array 130 may be partitioned to have MLC regions and SLC regions such that OS software data and normal user data may be simultaneously stored together. Since blocks of memory may be bad or become bad making it unusable, the memory array 130 may also include a localized block management directory 135 on the device itself to manage and update the different regions of the memory array 130. Unlike prior art MLC memory arrays, the MLC and SLC partitions are not fixed. The localized block management directory 135 is capable of dynamically changing and updating the MLC and SLC assignments depending on the needs of a particular application, updates to the application, or changes to the memory device itself Various embodiments of the MLC memory array 130 and the localized block management directory 135 are described in detail with reference to FIGS. 2-6.

Figure 2:
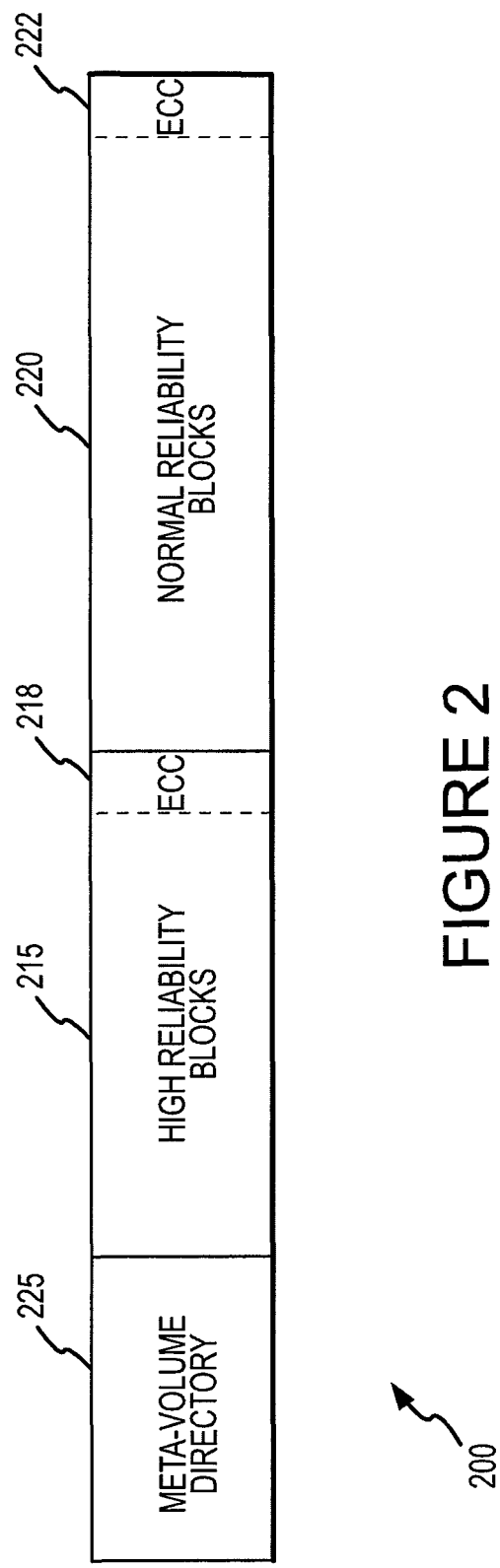
FIG. 2 is a block diagram of the memory array of FIG. 1 partitioned into data-type regions, according to an embodiment of the invention.

FIG. 2 is a block diagram of an MLC NAND memory device 200 partitioned into three regions according to an embodiment of the invention. The MLC NAND device is capable of operating in either an SLC mode to store data in a highly reliable sector or in a MLC mode for storing data in normal MLCs reserved for general data where a certain degree of error occurrence is acceptable. The MLC NAND device 200 includes high reliability blocks 215 for storing data in the SLC mode. Blocks generally include multiple pages of memory, but could also be any other fixed size or portion of memory. The data stored in the high reliability blocks 215 require 100% reliability, and are mainly read data. Generally, data stored in the high reliability blocks 215 may require only occasional updates, and are rarely moved around, and therefore generally have minimal error occurrences. As previously described, data that are ideally suited for storage in the high reliability blocks 215 include operation system software, boot code and other data that do not require frequent updates. The MLC NAND device 200 also includes normal (standard) reliability blocks 220 for storing data in the MLC mode. Normal data may include user data and any other data that are frequently read and written, and that can be moved around to various locations in the NAND device 200. Therefore, normal data may inherently contain errors and require frequent updates, but as explained data stored in the MLC mode allow for a certain amount of error tolerance due to the frequent updates and movement of data.

One technique that can be used to reduce data errors and thereby further increase the reliability of stored data on the NAND device 200 is to generate an error correcting code ("ECC") 218, 222 from each of the stored data or blocks of data, or page of data, and then store the ECC code 218, 222 with the data. The ECC codes 218 and 222 are generally shown in FIG. 2 corresponding to the high reliability blocks 215 and normal reliability blocks 220. Physically in the memory, however, ECC codes may be applied per page and written to memory along with the page of data, such that the data and the ECC code can be written to a similar location. When the data are read from the NAND device 200, the appropriate ECC code such as 218, 222 is also read, and used to determined if any bits of data are in error. In some cases, the ECC code 218, 222 may be also be used to correct the read data. The number of errors that can be corrected depends on the type of algorithm used and the number of error correcting bits. A number of ECC coding may be used from simple Hamming codes that correct single-bit errors to more complex coding algorithms such as the Bose-Chaudhuri-Hocquenghem ("BCH") code. In BCH coding, data bits to be transmitted are partitioned into fixed sizes of blocks, and ECC bits are added to each of the blocks, in order to protect each block from errors. Each of the partitioned sections of the NAND device 200 may utilize the same type of ECC bits, or the high reliability blocks 215 may be assigned with stronger ECC coding 218 than the ECC coding 222 utilized by the normal reliability blocks 220.

The NAND device 200 also includes a meta-volume directory 225, which are a set of blocks partitioned separately from the high reliability blocks 215 and the normal reliability blocks 220, and which store information about the NAND device 200 and its partitioned regions. The meta-volume directory 225 is a centralized data management system that is stored in the same NAND device 200 as the OS data and user data so that all data can be accessed, rearranged and managed on a single device, without the use of additional memory devices or a separate data management unit. The meta-volume directory 225 may be controlled by a separate file management system, software, or through commands and instructions from a processor or memory controller in the memory system. The meta-volume directory 225 preferably stores data in the SLC mode for higher reliability. The meta-volume directory 225 tracks changes to the other partitioned regions of the NAND device 200, and may be periodically updated to adjust the partitioning assignments of the NAND device 200, all of which will be explained in detail. Since the meta-volume directory 225 utilizes part of the NAND device 200, it may also be updated or rearranged such that the assignment of the partitioned regions can be dynamically changed. For example, if the normal reliability blocks 220 reach close to capacity, and large unused sections of the high reliability blocks 215 are available, the meta-volume directory 225 may be updated to reduce the partition size of high reliability blocks 215 so that some of the unused blocks are reassigned as normal reliability blocks 220. Therefore, the capacity of the normal reliability blocks 220 is made larger. Also, when new versions of OS software are periodically developed, the meta-volume directory 225 may be updated with the new versions.

The meta-volume directory 225 can also be utilized to track and manage bad blocks in the NAND device 200. Although the properties of flash memory make it well-suited for high-density applications, data integrity may be compromised due to a certain percentage of blocks going bad during the lifetime of the device, as is known by one skilled in the art. Each block in the NAND device 200 has a finite number of erase-write cycles that eventually results in the block becoming unusable. Software file management systems (not shown) commonly employ wear-leveling to spread write and erase operations as evenly as possible over all of the blocks in the NAND device 200. The software file management system also utilizes a reclaiming technique, where data is subsequently rewritten to a different, available memory block, and the old blocks are cleaned for reuse. To execute a reclamation operation, all valid data are copied onto another block and then the first block is erased at a later time to be made available as a cleaned spare block. The meta-volume directory 225 is capable of tracking all the memory blocks during wear-leveling and reclamation operations, to store the tracking information and to update the information as data is erased or written to memory blocks and as memory blocks are determined to be bad blocks. The bad blocks and replacement blocks may be centrally mapped in the meta-volume directory 225, thereby relying less on software to manage the system and without having to keep track of multiple maps dispersed throughout the NAND device 200. Having information stored in a centralized location speeds up access time to critical partition information and to bad block locations, and reduces the use of valuable chip space for storing large software files, or for storing information on memory block attributes in a separate location of the memory system.

Another issue that may compromise data integrity is power loss during a write operation. In prior art devices, file management systems are also relied on to ensure that no data is corrupted or that data is properly written after being interrupted by power loss. In prior art memory systems, memory blocks are tracked by the file management system and physical markers that point to a particular block or to a bad block. This typically runs the risk of markers becoming lost or pointing to an incorrect block, which is difficult to restore or correct. The meta-volume directory 225 may be configured to track all partitioning assignments to the memory device without the use of physical markers at individual block locations, and to regularly update assignment information, which is easily done when all the information is placed in a centralized location on the device itself. For example, when a write operation is interrupted during a power failure, the exact location of the most current version of data that was partially lost can be quickly identified and recovered, thereby eliminating the need of markers and the need to separately access the content and history of a selected block.

Figure 3:
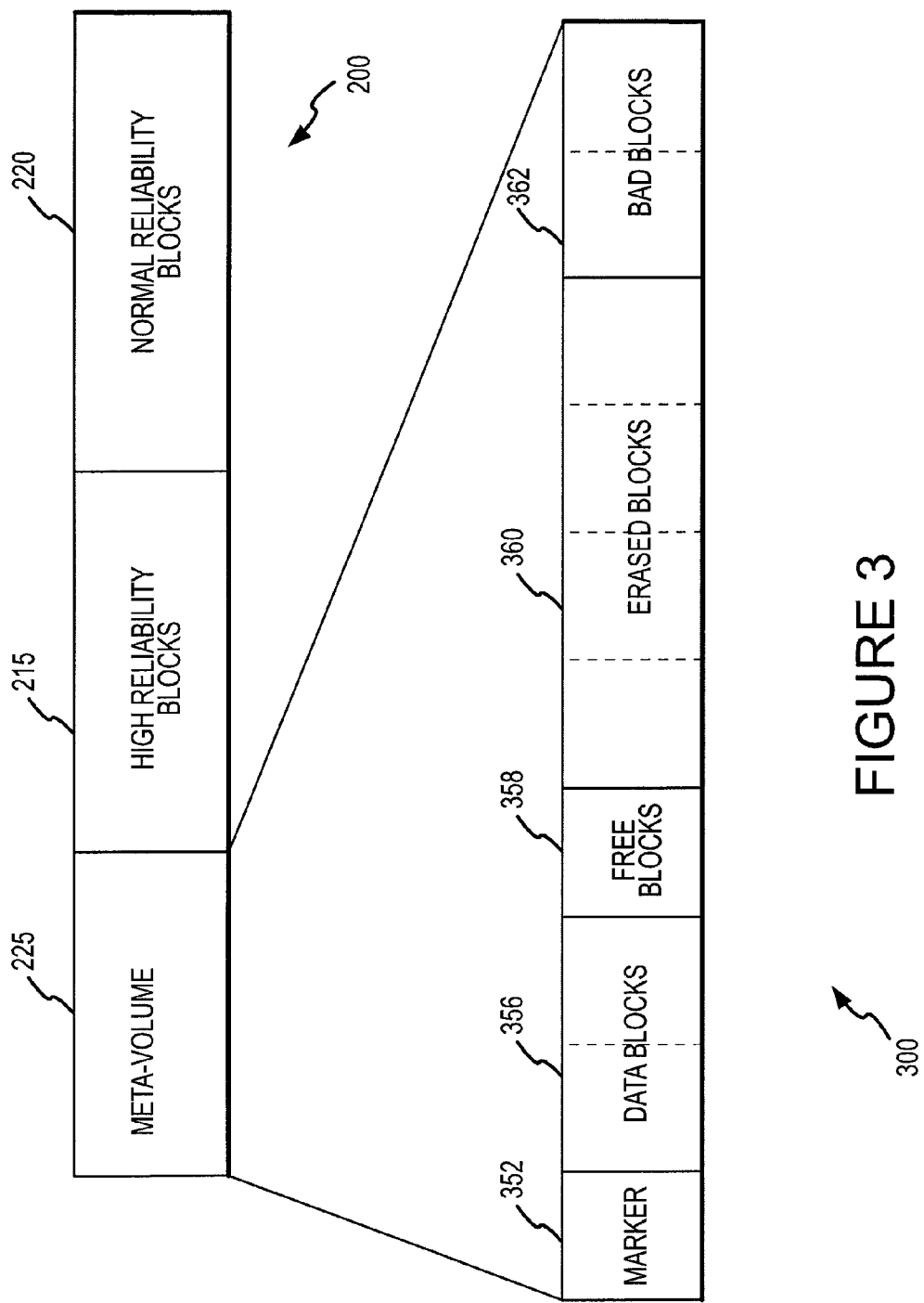
FIG. 3 is a block diagram of a meta volume partition, according to an embodiment of the invention.

An embodiment of the meta-volume directory 225 is shown in more detail in FIG. 3. The meta-volume directory 225 is located at a fixed location in the NAND device 200, and may be different from device to device due to bad blocks that are identified at the time of device testing. Meta-volume blocks 300 make up the meta-volume directory 225, and are used for storing and updating device information such as partitioning assignments, volume of the partitions, block history (wear-leveling and reclamation) and a bad block map. In the embodiment shown in FIG. 3, there are five types of meta-volume blocks 300 in the meta-volume directory 225. A dedicated marker block 352 identifies the start point and the end point of the meta-volume directory 225 since its size and location may vary from device to device, and because the data blocks contained in the meta-volume directory 225 should be distinguished from the rest of the memory blocks in the memory device. For example, if five meta-volume blocks 300 are needed, a total of eight blocks may be assigned as bad blocks need to be skipped to guarantee five good blocks are available. The marker block 352 may be placed either at the end or beginning of the meta-volume directory 225.

The meta-volume directory 225 includes one or more data blocks 356, which are used to store a variety of meta-volume data types involved in managing the device. The data types include, but are not limited to, bad block indicators, block types, number of erases, block identification, page identification and page counts. The data blocks 356 may include a partition count, which stores data representing the volume of data blocks assigned to each section of the NAND device 200. Partition tables are also included in the data blocks 356 that store block count information, the availability of data block storage, number of spare blocks, bad block counts, and whether the volume of data stored is high reliability data or normal reliability data. The volume type may be raw volume, which may be SLC stored data and more valuable, or may be sector volume, which may be MLC stored data. The partition table may include logical sector translation data capable of adjusting the raw volume and sector volumes so that each volume type is not fixed. The data blocks may also store a meta block map that tracks activity to the meta blocks and includes the latest updates to the region. The meta block map stores the block type of particular meta blocks, block identification, and tracks versions of meta blocks as they are updated such as the latest version is made available during new updates or after a power failure. The data blocks 356 may also include a bad block map that contains information on bad block counts, bad block map page counts, number of entries per page, bad block bit maps separating bad blocks from good blocks, and a map index. All the information stored the data blocks 356 are periodically updated to retain the latest storage information about the NAND device 200, change partition assignments, and track bad blocks, without having to utilize a separate file management storage region.

Other types of meta-volume blocks 300 include free blocks 358 and erased blocks 360. The free blocks 358 are included to ensure spare blocks are available during updates. Since the meta-volume directory 358 is in the NAND device 200, it may be updated in the same manner as other parts of the NAND device 200, that is by copying blocks of data onto clean blocks and then later erasing the old blocks, as previously described. Updates consequently generate erased blocks 360 that have been cleaned of old data and may be used in future updates. Additionally, like any other memory block in the NAND device 200, any one of the meta-volume blocks 300 may become unusable or may have originally been bad blocks 362.

Figure 4:
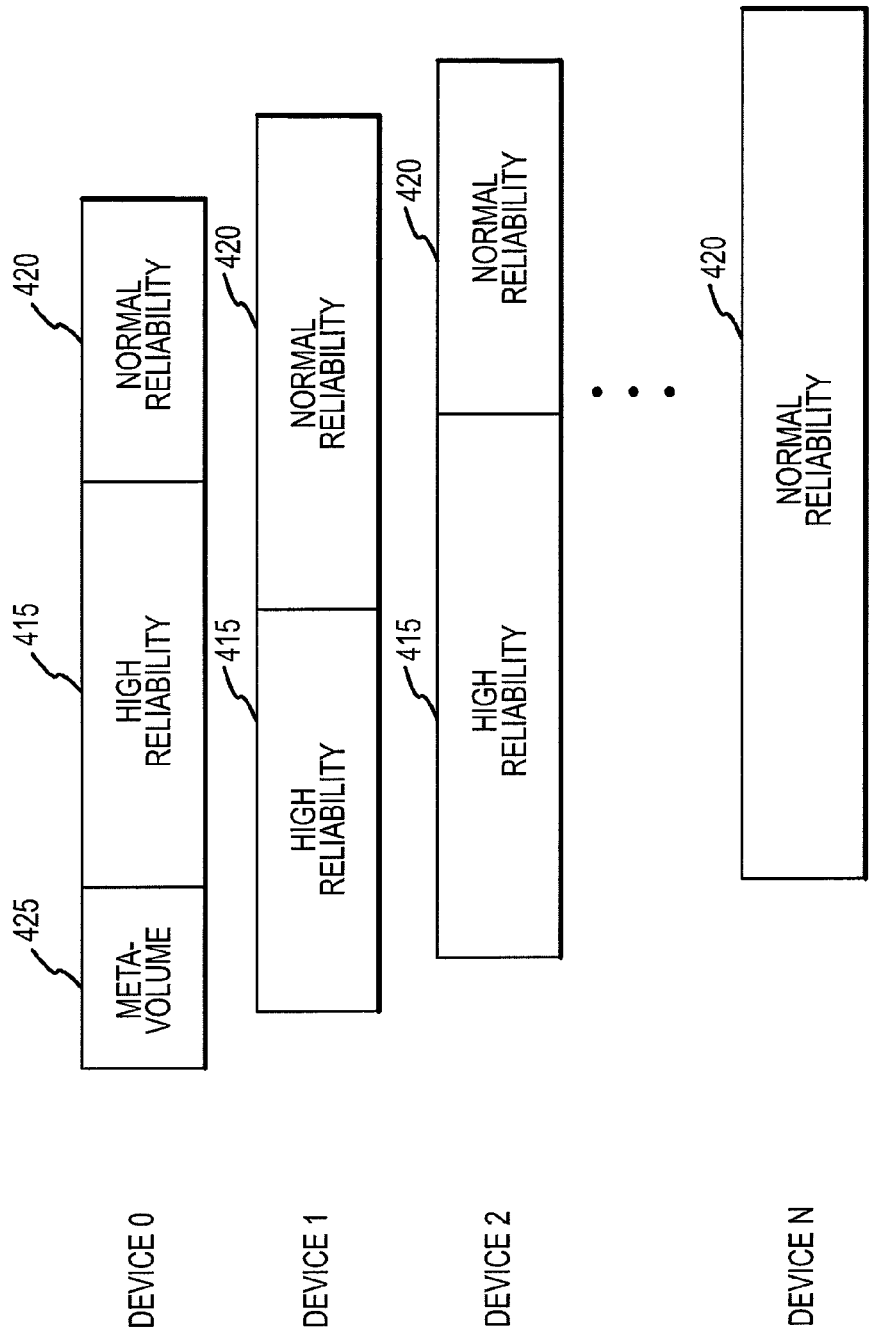
FIG. 4 is a block diagram of a meta volume partition management system for a plurality of memory devices, according to an embodiment of the invention.

FIG. 4 shows an embodiment of the invention that includes a meta-volume directory 425 for managing multiple NAND devices (Device 0-N). For example, the meta-volume directory 425 is placed in a single location on Device 0 to manage multiple devices, Device 1-Device N. Each device can then be fully utilized as high reliability blocks 415, normal reliability blocks 420 or partitioned as combination of high reliability blocks 415 and normal reliability blocks 420 in the same manner for partitioning a single memory device as previously described. The meta-volume directory 425 may also be capable of dynamically adjusting the partitioning assignments to change the volume type of one or more memory devices.

Figure 5:
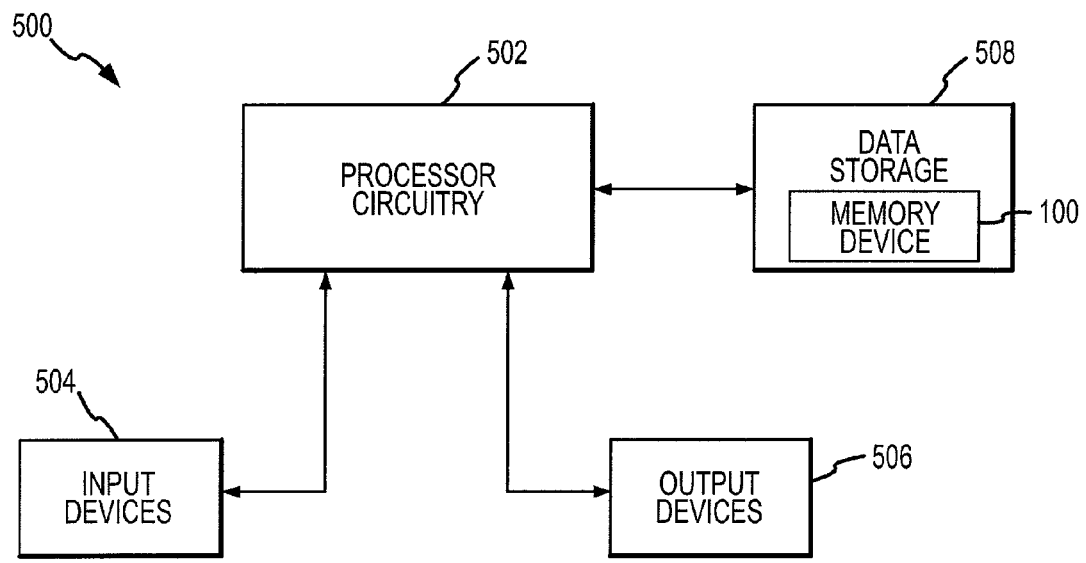
FIG. 5 is a simplified block diagram of a processor-based system including the non-volatile memory device of FIG. 1, according to an embodiment of the invention.

FIG. 5 is a block diagram of a processor-based system 500 including processor circuitry 502 having a memory device 100 of FIG. 1. The processor circuitry 502 is coupled through address, data, and control buses to the memory device 100 to provide writing data to and reading data from the memory device 100. The processor circuitry 502 includes circuitry for performing various processing functions, such as executing specific software to perform specific calculations or tasks. The processor-based system 500 also includes one or more input devices 504 coupled to the processor circuitry 502 to allow an operator to interface with the processor-based system 500. Examples of input devices 504 include keypads, touch screens, and scroll wheels. The processor-based system 500 also includes one or more output devices 506 coupled to the processor circuitry 502 to provide output information to the operator. In one example, the output device 506 is a visual display providing visual information to the operator. Data storage 508 is also coupled to the processor circuitry 502 to store data that is to be retained even when power is not supplied to the processor-based system 500 or to the data storage 508. The memory device 100, or a memory device according to some other example of the invention, can be used for the data storage 508.

Figure 6:
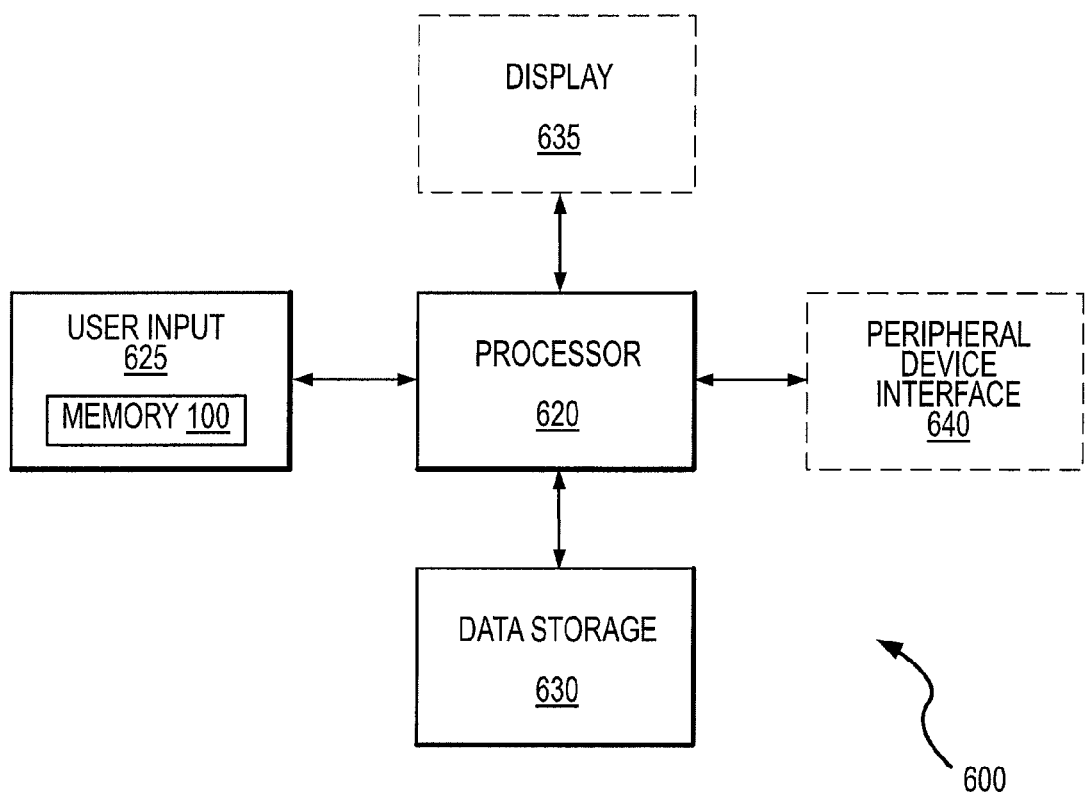
FIG. 6 is a simplified block diagram of a consumer device having a user input component that includes the non-volatile memory device of FIG. 1, according to another embodiment of the invention.

FIG. 6 is a block diagram of a consumer device 600 having a processor 620 and a user input 625 that includes the memory device 100 of FIG. 1 according to embodiments of the invention. The consumer device 600 may be a digital camera, vehicle navigation system, videophone, cell phone, audio player, or other small devices and portable devices. The processor 620 may be a microprocessor, digital signal processor, or part of a central processing unit that communicates with the user input 625 over a bus. The processor may 620 additionally have a random access memory (RAM) or, alternatively, the user input 625 may include the memory 100 to which the processor communicates over the bus. The memory device 100 may be a non-volatile memory, such as a FLASH NAND memory, that is capable of storing both code and user data, as described in the embodiments above. The processor 620 can, therefore, dynamically update or adjust the various partitions in the memory device 100 to access and manage both code and user data from a centralized location in the memory device 100 within the user input device 625. The memory device 100 may be combined with the processor 620 with or without memory storage on a single integrated circuit or on a different chip than the processor 620. The consumer device 600 optionally includes a display 635, such as a cathode ray tube (CRT) or liquid crystal display (LCD), for displaying image data, which may be stored in the memory 100, or in a data storage device 630, such as removable Flash memory, or in combinations of those locations. The consumer device 600 may optionally have a peripheral device interface 640 so that the processor 620 may communicate with a peripheral device (not shown). A number of peripheral devices may be connected to the consumer device 600, such as a camera lens, an audio recorder or a microphone, a battery pack, and so on.

Although the embodiments of the present invention have been described with reference to the disclosed embodiments, persons skilled in the art will recognize that changes may be made in form and detail without departing from the embodiments of the invention. Such modifications are well within the skill of those ordinarily skilled in the art.

I claim:

1. A system for partitioning a non-volatile memory device comprising:
a memory array of multi-level memory cells;
a first addressable range of memory blocks of the memory array, the first addressable range of memory blocks configured as single level memory cells, and further configured to store at least one type of data, wherein the at least one type of data comprises software code and a first error correcting code;

a second addressable range of memory blocks of the memory array, the second addressable range of memory blocks configured to store at least another type of data wherein the at least another type of data comprises user data and a second error correcting code, wherein the first and second error correcting codes are different, and wherein the first error correcting code is based on error correcting coding that codes data with a higher reliability level than error correcting coding on which the second error correcting code is based; and a third addressable range of memory blocks of the memory array, the third addressable range of memory blocks configured as single level memory cells and further configured to store attribute data of the first, second, and third addressable ranges of memory blocks, wherein updating the attribute data causes a region of the first or second addressable range of memory blocks to be converted to the second or first addressable range of memory blocks, respectively, and wherein the third addressable range is located at a fixed location in the non-volatile memory device, which is identified at a time of testing the non-volatile memory device, and wherein the attribute data is updated to track all converted memory blocks of the first and second addressable ranges without the use of physical markers located in the individual blocks of the first and second addressable ranges.

2. The system of claim 1 wherein the at least one type of data stored in the first addressable range of memory blocks comprises data stored as one-bit data.

3. The system of claim 1 wherein the attribute data stored in the third addressable range of memory blocks comprises a bad block map to identify and locate bad memory blocks.

4. The system of claim 1 wherein the attribute data comprises data that includes bad block indicators, block type, number of erases, block identification, page identification, page count, partition count, raw volume assignments, and sector volume assignments.

5. The system of claim 1 wherein the attribute data is stored with an associated error correcting code.

6. A non-volatile memory device comprising:

an array of memory cells arranged into three partitions, wherein memory cells of a first partition are configured to store data as single bit data and memory cells of a second partition are configured to store data as multi-bit data, wherein memory cells of the first partition and memory cells of the second partition are convertible between the first and second partitions responsive to updates to associated attribute data, wherein memory cells of a third partition are configured to store data as single bit data and further configured to store the attribute data, wherein the attribute data represents attribute information of the non-volatile memory device, including the three partitions, wherein the memory cells of the first partition are configured to store software code, wherein the memory cells of the second partition are configured to store user data, wherein the memory cells of the first partition are configured to store a first plurality of error correction codes corresponding to the software code and the memory cells of the second partition are configured to store a second plurality of error correction codes corresponding to the user data, wherein the first plurality of error correction codes and the second plurality of error correction codes are generated by different error correction coding, and wherein the error correction coding used to generate the first plurality of error correction codes codes data with a higher reliability level than the error correction coding used to generate the second plurality of error correction codes, wherein the array of memory cells is configurable to dynamically change the number of cells in the second partition and the number of cells in the first partition such that a portion of the number of cells in the second partition are converted to the first partition or such that a portion of the number of cells of the first partition are converted to the second partition, wherein the attribute data is updated to track all converted memory cells of the first and second partitions without the use of physical markers being located in the first and second partitions, and wherein the third partition is located at a fixed location in the non-volatile memory device, which is identified at a time of testing the non-volatile memory device.

7. A NAND FLASH memory device comprising:

a first array of NAND structured memory cells configured as multi-level cells, wherein the multi-level cells store user data, the first array of NAND structured memory cells configurable to have a first reliability level and comprise a first plurality of error correction codes; and a second array of NAND structured memory cells configured as single-level cells, the second array of NAND structured memory cells configurable to have a second level of reliability greater than the first level of reliability and comprise a second plurality of error correction codes, wherein the first plurality of error correction codes and the second plurality of error correction codes are generated by different error correction coding, the second array of NAND structured memory comprising:

a predetermined portion selected to store attribute information of the NAND FLASH memory device, the predetermined portion being configurable to update and adjust partition information of the first and second arrays of the NAND structured memory cells, wherein the second array is configurable to dynamically update the partition information when memory cells of the first array are converted to single-level memory cells, and wherein the second array is configurable to dynamically update the partition information when memory cells of the second array are converted to multi-level cells;

wherein the predetermined portion is fixed in location and size and includes a marker block that identifies a starting and ending point of the predetermined portion within the second array, and wherein the fixed location is identified at a time of testing of the NAND FLASH memory device, and wherein memory cells of the predetermined portion are not converted to multi-level memory cells.

8. The NAND FLASH memory device of claim 7 wherein the attribute information comprises a partition map of the first and second arrays of the NAND structured memory cells and of the data contained in the first and second arrays.

9. The NAND FLASH memory device of claim 7 wherein the predetermined portion of the second array is configured to update responsive, at least in part, to a file management software.

10. The NAND FLASH memory device of claim 7 wherein the single bit data further comprises software data.

11. A system comprising:
   a processor operable to process data and to provide memory commands and addresses to request read data or instruct write data;
   an input device coupled to the processor;
   an output device coupled to the processor; and
   a non-volatile memory device coupled to the processor and operable to receive the read request or the write instruction from the processor, the non-volatile memory comprising:
   a first addressable range of memory blocks comprising:
      a first partitioned region configured to store at least one type of data received from the processor, wherein the at least one type of data comprises software code, and wherein memory cells of the first partitioned region are configured as single-level cells; and
      a second partitioned region configured to store at least another type of data received from the processor, wherein the at least another type of data comprises user data, and
      wherein memory cells of the second partitioned region are configured as multi-level cells, wherein the at least one type of data and the another type of data are each stored with respective error correcting codes, and wherein error correcting codes associated with the at least one type of data are generated based on a first type of error correcting coding and error correcting codes associated with the at least another type of data are generated based on a second type of error correcting coding, the first error correcting coding that codes data with a higher reliability level than the second error correcting coding; and
   a second addressable range of memory blocks configured to store attribute data of the first addressable range of memory blocks, the second addressable range of memory blocks being configurable to update the attribute data, wherein updating the attribute data causes memory cells from the first partitioned region to be converted to memory cells of the second partitioned region, and further causes memory cells of the second partitioned region to be converted to memory cells of the first partitioned region, wherein memory cells converted from the first partitioned region to the second partitioned region are reconfigured to be single-level memory cells, and wherein memory cells converted from the second partitioned region to the first partitioned region are reconfigured to be multi-level memory cells,
   wherein the second addressable range of memory blocks is located at a fixed location within the non-volatile memory device, the fixed location determined at a time of testing the non-volatile memory device, and
   wherein the second addressable range of memory blocks is updated to track all converted memory blocks of the first and second partitioned regions without the use of physical markers located in the first and second partitioned regions.

12. The system of claim 11 wherein the memory device is configured to receive command signals and address signals from the processor, and operable to read data from the memory device, write data to the memory device, and update data on the memory device responsive to the command and address signals.

13. The system of claim 11 wherein the at least one type of data stored in first addressable range of memory blocks comprises data stored as one-bit data.

14. The system of claim 11 wherein the second addressable range of memory blocks comprises being configurable to store the attribute data as one-bit data.

15. The system of claim 11 wherein the attribute data stored in the second addressable range of memory blocks comprises a bad block map to identify and locate bad memory blocks.

16. The system of claim 11 wherein the second addressable range of memory blocks further comprises:
   a marker block configured to differentiate the second addressable range of memory blocks from the first addressable range of memory blocks;
   at least one data block configured to store the attribute data; and
   at least one spare block configured to store data when the at least one data block is occupied.

17. The system of claim 16 wherein the attribute data stored in the at least one data block comprises data that includes bad block indicators, block type, number of erases, block identification, page identification, page count, partition count, raw volume assignments, and sector volume assignments.

18. The system of claim 11 wherein the second addressable range of memory blocks further comprises being configurable to update the stored attribute data in response to memory commands and addresses from the processor, and to dynamically adjust the first and second partitioned regions of the first addressable range of memory block responsive to the update.

19. A consumer device comprising:
   a processor operable to process data, addresses, control commands, and memory commands; and
   a user input device coupled to the processor, the user input device comprising a non-volatile memory device comprising:
   an array of multi-level memory cells arranged in rows and columns, the array of multi-level memory cells configurable to be either single level cells or multi-level cells, wherein a first predetermined number of cells are configured as single level cells and a second predetermined number of cells are configured as multi-level cells,
   a third predetermined number of cells configured as single level cells, the first predetermined number of cells including data representing attribute information of the non-volatile memory device, and a first plurality of error correction codes; and
   the second predetermined number of cells including a second plurality of error correction codes, wherein the first plurality of error correction codes and the second plurality of error correction codes are generated by different error correction coding, and wherein the error correction coding used to generate the first plurality of error correction codes codes data with a higher reliability level than the error correction coding used to generate the second plurality of error correction codes,
   wherein the non-volatile memory device is configurable to dynamically convert memory cells of the first predetermined number of cells to the second predetermined number of cells such that the converted memory cells of the first predetermined number of cells are reconfigured as single level cells or convert memory cells of the second predetermined number of cells to the first predetermined number of cells such that the converted memory cells of the second predetermined number of cells are reconfigured as multi-level cells,
wherein the attribute information comprises a marker block that identifies starting and ending points of the third predetermined number of cells,
wherein the third predetermined number of cells is located at a fixed location in the non-volatile memory device, the fixed location identified at a time of testing the non-volatile memory device, and
wherein the attribute information is updated to track all converted memory blocks of the first and second predetermined numbers of cells without the use of physical markers located in individual blocks of the first and second predetermined numbers of cells.

20. The consumer device of claim 19 wherein the non-volatile memory device comprises a NAND FLASH memory device operable to store data.

21. The consumer device of claim 20 wherein the first predetermined number of cells comprises software data, and the second predetermined number of cells comprises user data.

22. The consumer device of claim 21 further comprising a display screen coupled to the processor, the display screen configurable to display an image stored as user data in the non-volatile memory device.

23. The consumer device of claim 21 wherein the user input device comprises a complementary metal oxide silicon imager device configurable to store image data as user data and programming code as software data.

24. The consumer device of claim 21 wherein the user input device comprises an audio receiver/transmitter device configurable to store audio signal data as user data and programming code as software data.

* * * * *